United States Patent
Kim et al.

(10) Patent No.: US 10,347,207 B2
(45) Date of Patent: Jul. 9, 2019

(54) SCAN DRIVER AND DRIVING METHOD THEREOF

(71) Applicant: SAMSUNG DISPLAY CO., LTD., Yongin-si, Gyeonggi-do (KR)

(72) Inventors: Jong Hee Kim, Yongin-si (KR); Ji Hye Lee, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 100 days.

(21) Appl. No.: 15/136,287

(22) Filed: Apr. 22, 2016

(65) Prior Publication Data
US 2017/0076684 A1   Mar. 16, 2017

(30) Foreign Application Priority Data

Sep. 14, 2015   (KR) .................. 10-2015-0129822

(51) Int. Cl.
  *G09G 3/36*   (2006.01)
  *G11C 19/28*  (2006.01)

(52) U.S. Cl.
  CPC ......... *G09G 3/3677* (2013.01); *G11C 19/287* (2013.01); *G09G 2310/0286* (2013.01)

(58) Field of Classification Search
  CPC ......... G09G 3/3677; G09G 2310/0286; G09G 3/3607–3696
  See application file for complete search history.

(56) References Cited

U.S. PATENT DOCUMENTS

| | | | |
|---|---|---|---|
| 2010/0079443 A1* | 4/2010 | Chang .................. | G09G 3/3677 345/214 |
| 2010/0110047 A1* | 5/2010 | Yoon .................... | G09G 3/3677 345/204 |
| 2011/0157124 A1* | 6/2011 | Jung ....................... | G11C 19/28 345/211 |
| 2012/0249518 A1* | 10/2012 | Won ...................... | G09G 3/3674 345/213 |
| 2013/0038587 A1* | 2/2013 | Song ....................... | G09G 5/18 345/211 |
| 2015/0042383 A1 | 2/2015 | Kwon et al. | |
| 2016/0203762 A1 | 7/2016 | Kim et al. | |
| 2016/0203783 A1 | 7/2016 | Kim et al. | |
| 2016/0210926 A1 | 7/2016 | Amino et al. | |

FOREIGN PATENT DOCUMENTS

| | | |
|---|---|---|
| KR | 10-2016-0087950 | 7/2016 |
| KR | 10-2016-0087951 | 7/2016 |
| KR | 10-2016-0089937 | 7/2016 |
| KR | 10-2016-0100084 | 8/2016 |

\* cited by examiner

*Primary Examiner* — Hang Lin
(74) *Attorney, Agent, or Firm* — Lewis Roca Rothgerber Christie LLP

(57) ABSTRACT

A scan driver includes a plurality of stages to receive one or more clock signals, each of the plurality of stages to supply a carry signal to a corresponding first output terminal and to supply a scan signal to a corresponding second output terminal, corresponding to a voltage of a corresponding first node, and each of the plurality of stages including a reset unit, the reset unit to initialize the first node, the first output terminal, and the second output terminal, corresponding to a gate start pulse supplied to a corresponding reset input terminal.

18 Claims, 13 Drawing Sheets

SCAN DRIVER AND DRIVING METHOD THEREOF

CROSS-REFERENCE TO RELATED APPLICATION

This application claims priority to and the benefit of Korean Patent Application No. 10-2015-0129822, filed on Sep. 14, 2015, in the Korean Intellectual Property Office, the entire content of which is incorporated herein by reference in its entirety.

BACKGROUND

1. Field

One or more aspects of example embodiments of the present disclosure relate to a scan driver and a driving method thereof, and more particularly, to a scan driver and a driving method thereof with improved reliability.

2. Description of the Related Art

With the development of information technology, the importance of a display device, which is a connection medium between a user and information, increases. Accordingly, display devices, such as liquid crystal display devices and organic light emitting display devices, are increasingly used.

In general, a display device includes a data driver for supplying data signals to data lines, a scan driver for supplying scan signals to scan lines, and a pixel unit including pixels arranged at areas or regions (e.g., crossing regions) defined by the scan lines and the data lines.

The pixels included in the pixel unit are selected when a scan signal is supplied to a scan line, to receive a data signal supplied from a data line. The pixels emit light having a luminance corresponding to the received data signal.

The scan driver includes stages coupled to the scan lines. The stages supply scan signals to the scan lines coupled thereto, corresponding to signals from a timing controller. Each stage is configured with a P-type (e.g., PMOS) transistor and/or an N-type (e.g., NMOS) transistor. The stages may be concurrently (e.g., simultaneously) mounted together with the pixels on a panel.

A low frequency driving method has recently been proposed to reduce power consumption. The low frequency driving method is a method in which a pixel maintains the voltage of a data signal for a certain period, e.g., a period of two frames or more, thereby implementing an image. However, when a scan driver is driven by the low frequency driving method, characteristics of transistors included in the scan driver may be easily changed, and therefore, the reliability of the scan driver may be decreased or lowered. Accordingly, a scan driver having reliability in low frequency driving is desired.

The above information disclosed in this Background section is for enhancement of understanding of the background of the invention, and therefore, it may contain information that does not constitute prior art.

SUMMARY

One or more aspects of example embodiments of the present disclosure are directed toward a scan driver and a driving method thereof, which may be applied to low frequency driving and may have improved reliability.

According to an example embodiment of the present disclosure, a scan driver includes: a plurality of stages configured to receive one or more clock signals, each of the plurality of stages being configured to supply a carry signal to a corresponding first output terminal and to supply a scan signal to a corresponding second output terminal, corresponding to a voltage of a corresponding first node; and each of the plurality of stages comprises a reset unit, the reset unit being configured to initialize the first node, the first output terminal, and the second output terminal, corresponding to a gate start pulse supplied to a corresponding reset input terminal.

Each of the plurality of stages may include: a first power input terminal configured to receive a first off voltage; and a second power input terminal configured to receive a second off voltage.

The second off voltage may be a voltage level lower than that of the first off voltage.

The first off voltage and the second off voltage may be a same voltage level.

The reset unit may include: a first transistor coupled between the first node and the second power input terminal, the first transistor including a gate electrode coupled to the reset input terminal; a second transistor coupled between the first output terminal and the second power input terminal, the second transistor including a gate electrode coupled to the reset input terminal; and a third transistor coupled between the second output terminal and the first power input terminal, the third transistor including a gate electrode coupled to the reset input terminal.

The first to third transistors may be configured to be in a turn-on state when the gate start pulse is supplied.

An ith (i is a natural number) stage from among the stages may include: an output unit configured to supply an ith carry signal to the first output terminal, and to supply an ith scan signal to the second output terminal, corresponding to the voltage of the first node, a voltage of a second node, and a first clock signal supplied to a first input terminal; a controller configured to control the voltage of the second node, corresponding to the first clock signal supplied to the first input terminal; a pull-up unit configured to control the voltage of the first node, corresponding to an (i−1)th carry signal supplied to a second input terminal; and a pull-down unit configured to control the voltage of the first node, corresponding to the voltage of the second node and an (i+1)th carry signal supplied to a third input terminal.

A second clock signal having an inverted phase with respect to the first clock signal may be supplied to a first input terminal of an (i−1)th stage from among the stages.

The pull-up unit may include a fourth transistor including a first electrode and a gate electrode, the first electrode and the gate electrode being coupled to the second input terminal, and may include a second electrode coupled to the first node.

The ith stage may be a first stage, and the pull-up unit may further include a fifth transistor coupled between the second input terminal and the second power input terminal, the fifth transistor including a gate electrode coupled to the reset input terminal.

The output unit may include: a sixth transistor coupled between the first input terminal and the first output terminal, the sixth transistor including a gate electrode coupled to the first node; a seventh transistor coupled between the first output terminal and the second power input terminal, the seventh transistor including a gate electrode coupled to the second node; an eighth transistor coupled between the first output terminal and the second power input terminal, the eighth transistor including a gate electrode coupled to the third input terminal; a ninth transistor coupled between the first input terminal and the second output terminal, the ninth transistor including a gate electrode coupled to the first node; a tenth transistor coupled between the second output terminal and the first power input terminal, the tenth transistor including a gate electrode coupled to the second node; an eleventh transistor coupled between the second output terminal and the first power input terminal, the eleventh transistor including a gate electrode coupled to the third input terminal; and a first capacitor coupled between the first node and the second output terminal.

The controller may include: a twelfth transistor including a first electrode and a gate electrode, the first electrode and the gate electrode being coupled to the first input terminal; a thirteenth transistor coupled between a second electrode of the twelfth transistor and the second power input terminal, the thirteenth transistor including a gate electrode coupled to the first output terminal; a fourteenth transistor coupled between the first input terminal and the second node, the fourteenth transistor including a gate electrode coupled to the second electrode of the twelfth transistor; and a fifteenth transistor coupled between the second node and the second power input terminal, the fifteenth transistor including a gate electrode coupled to the first output terminal.

The pull-down unit may include: a sixteenth transistor coupled between the first node and the second power input terminal, the sixteenth transistor including a gate electrode coupled to the third input terminal; and a seventeenth transistor coupled between the first node and the second power input terminal, the seventeenth transistor including a gate electrode coupled to the second node.

Each of the sixteenth transistor and the seventeenth transistor may include a plurality of transistors coupled in series.

The scan driver may further include: a first dummy stage located at a front end of a first stage from among the plurality of stages, the first dummy stage being configured to supply a first dummy carry signal to the first stage corresponding to the gate start pulse; and a second dummy stage located at a rear end of a last stage from among the plurality of stages, the second dummy stage being configured to supply a second dummy carry signal to the last stage.

The gate start pulse may have a width that is greater than or equal to that of a half period of a clock signal of the one or more clock signals.

According to an example embodiment of the present disclosure, a method of driving a scan driver including a plurality of stages supplied with one or more clock signals, the plurality of stages supplying carry signals to first output terminals, and supplying scan signals to second output terminals, corresponding to voltages of first nodes, includes: initializing a first node, a first output terminal, and a second output terminal of each of the plurality of stages, when a gate start pulse is supplied.

The gate start pulse may have a width that is greater than or equal to a half period of a clock signal of the one or more clock signals.

When a panel including the scan driver is driven at a low frequency, the stages may maintain an initialization state, corresponding to the gate start pulse, and the clock signal may maintain a low voltage during the low frequency driving.

When the gate start pulse is supplied, the second output terminal may be supplied with a first off voltage, and the first node and the first output terminal may be supplied with a second off voltage lower than the first off voltage.

According to one or more aspects of example embodiments of the present disclosure, in the scan driver and the driving method thereof, transistors included in the reset unit of each stage are driven by the gate start pulse. In this case, the transistors included in the reset unit are turned on during a partial period of a frame, and accordingly, it may be possible to minimize or reduce a change in characteristics of the transistors. That is, according to one or more aspects of example embodiments of the present disclosure, when the gate start pulse is supplied, the transistors included in the reset unit are set in the turn-on state, thereby improving the reliability of driving.

BRIEF DESCRIPTION OF THE DRAWINGS

The above and other aspects and features of the present invention will become more apparent to those skilled in the art from the following detailed description of the example embodiments with reference to the accompanying drawings.

DETAILED DESCRIPTION

Figure 1:
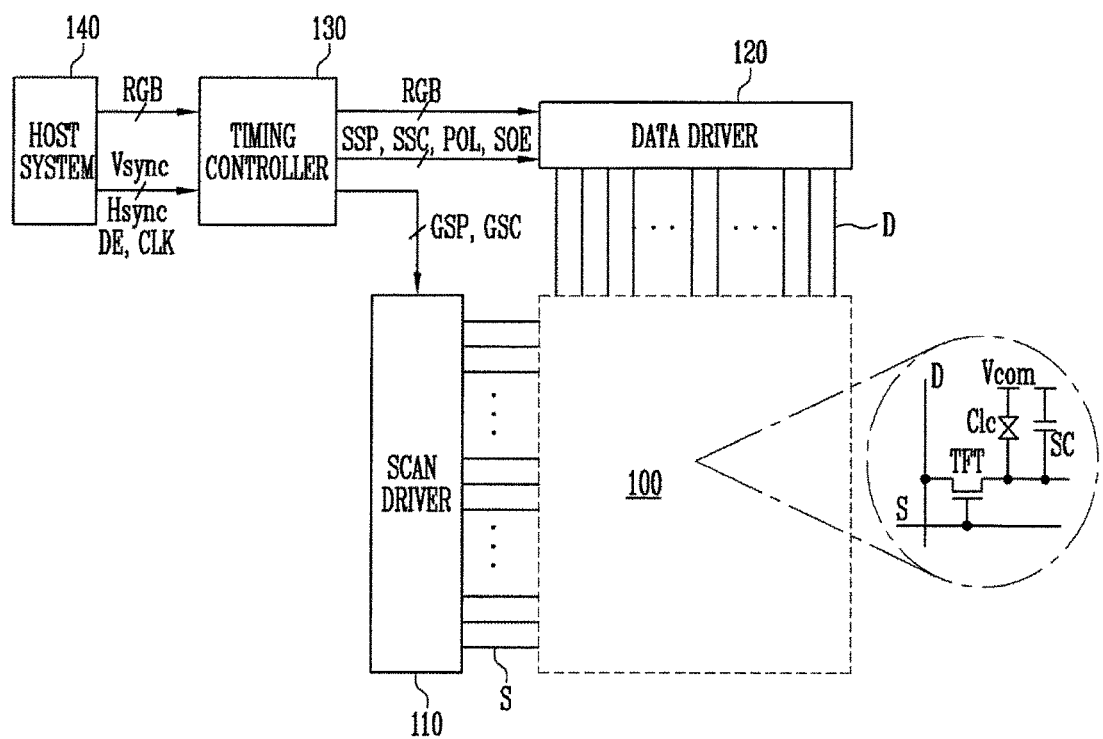
FIG. 1 is a block diagram schematically illustrating a display device according to an embodiment of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram schematically illustrating a display device according to an embodiment of the present disclosure. In FIG. 1, it is assumed that, for convenience of illustration, the display device is a liquid crystal display device. However, the present disclosure is not limited thereto.

Referring to FIG. 1, the display device according to an embodiment of the present disclosure includes a pixel unit 100, a scan driver 110, a data driver 120, a timing controller 130, and a host system 140.

The pixel unit 100 refers to an effective display unit of a liquid crystal panel. The liquid crystal panel includes a thin film transistor (hereinafter, referred to as a "TFT") substrate and a color filter substrate. A liquid crystal layer is formed between the TFT substrate and the color filter substrate. Data lines D and scan lines S are formed on the TFT substrate, and a plurality of pixels are arranged at areas or regions defined by the scan lines S and the data lines D.

A TFT included in each pixel transmits, to a liquid crystal capacitor Clc, a voltage of a data signal supplied via a data line D in response to a scan signal from a scan line S. A gate electrode of the TFT is coupled to the scan line S, and a first electrode of the TFT is coupled to the data line D. A second electrode of the TFT is coupled to the liquid crystal capacitor Clc and a storage capacitor SC.

Here, the first electrode may be any one of source and drain electrodes of the TFT, and the second electrode may be an electrode different from the first electrode. For example, when the first electrode is a drain electrode, the second electrode is a source electrode. Also, liquid crystals between a pixel electrode and a common electrode, which are formed on the TFT substrate, are equivalently expressed as the liquid crystal capacitor Clc. The storage capacitor SC maintains or substantially maintains a voltage of a data signal transmitted to the pixel electrode for a time (e.g., a predetermined time) until a next data signal is supplied.

A black matrix, a color filter, and/or the like may be formed on the color filter substrate.

The common electrode is formed on the color filter substrate in a vertical electric field driving manner, such as a twisted nematic (TN) mode and/or a vertical alignment (VA) mode. The common electrode is formed together with the pixel electrode on the TFT substrate in a horizontal electric field driving manner, such as an in-plane switching (IPS) mode and/or a fringe field switching (FFS) mode. A common voltage Vcom is supplied to the common electrode. A liquid crystal mode of the liquid crystal panel may be implemented as any suitable liquid crystal mode, as well as the above-described TN mode, VA mode, IPS mode, and/or FFS mode.

The data driver 120 converts image data RGB input from the timing controller 130 into a positive/negative gamma compensation voltage to generate a positive/negative data voltage (e.g., analog data voltage). The positive/negative data voltage generated by the data driver 120 is supplied as a data signal to the data lines D.

Figure 2:
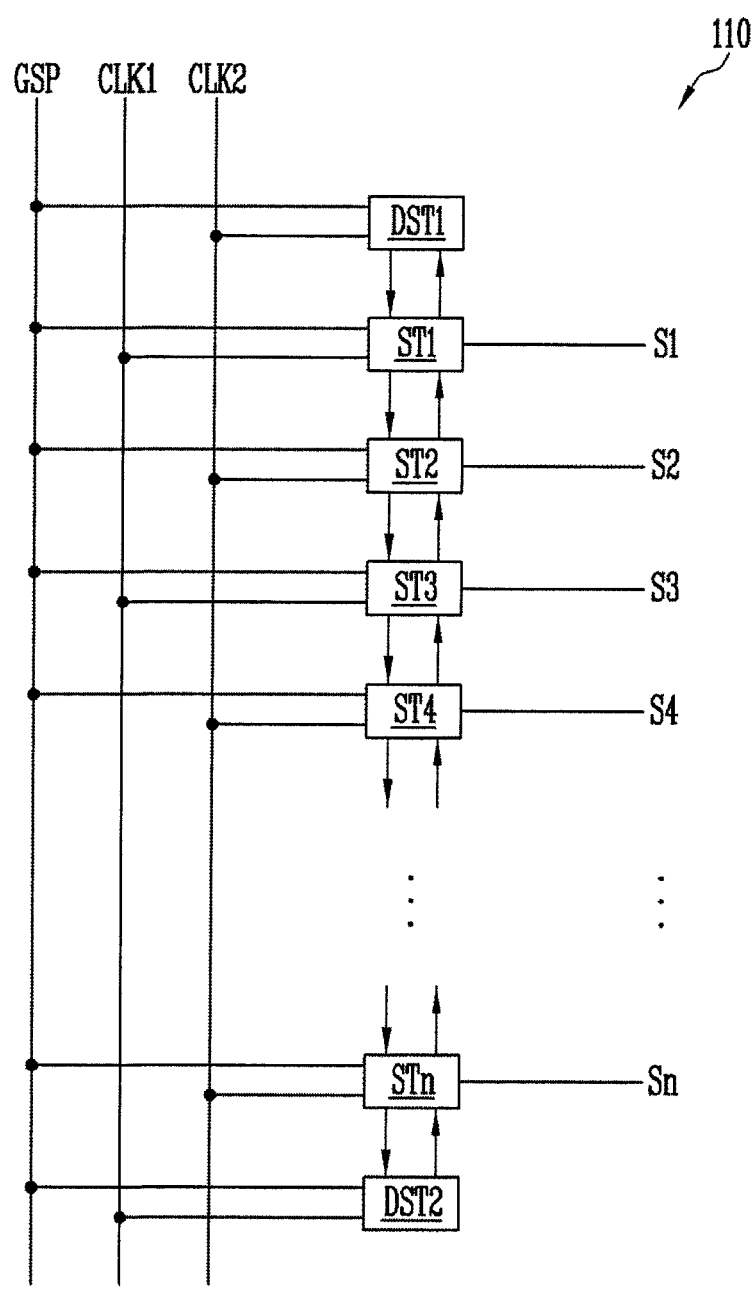
FIG. 2 is a diagram schematically illustrating a scan driver shown in FIG. 1.

The scan driver 110 supplies scan signals to the scan lines S. For example, the scan driver 110 may sequentially supply scan signals to the scan lines S. When scan signals are sequentially supplied to the scan lines S, pixels are selected in units of horizontal lines, and the pixels selected by the scan signals are supplied with data signals. The scan driver 110, as shown in FIG. 2, includes stages ST1 to STn respectively coupled to the scan lines S1 to Sn. The scan driver 110 may be mounted in the form of an amorphous silicon gate (ASG) driver on the liquid crystal panel. That is, the scan driver 110 may be mounted on the TFT substrate through a thin film process. Also, the scan driver 110 may be mounted at both sides (e.g., two opposite sides) of the liquid crystal panel with the pixel unit 100 therebetween.

The timing controller 130 supplies a gate control signal to the scan driver 110 and supplies a data control signal to the data driver 120, according to timing signals including image data RGB, a vertical synchronization signal Vsync, a horizontal synchronization signal Hsync, a data enable DE, a clock signal CLK, and/or the like.

The gate control signal includes a gate start pulse GSP, one or more gate shift clocks GSC, and/or the like. The gate start pulse GSP controls timing of a first scan signal. The gate shift clock GSC refers to one or more clock signals for shifting the gate start pulse GSP.

The data control signal includes a source start pulse SSP, a source sampling clock SSC, a source output enable SOE, a polarity control signal POL, and/or the like. The source start pulse SSP controls data sampling start timing of the data driver 120. The source sampling clock SSC controls a sampling operation of the data driver 120 based on a rising or falling edge. The source output enable SOE controls an output timing of the data driver 120. The polarity control signal POL inverts the polarity of a data signal output from the data driver 120.

The host system 140 supplies image data RGB to the timing controller 130 through an interface, such as low voltage differential signaling (LVDS) and/or transition minimized differential signaling (TMDS). Also, the host system 140 supplies timing signals (e.g., Vsync, Hsync, DE, and CLK) to the timing controller 130.

FIG. 2 is a diagram schematically illustrating the scan driver shown in FIG. 1.

Referring to FIG. 2, the scan driver 110 includes a plurality of stages ST1 to STn, a first dummy stage DST1, and a second dummy stage DST2.

Each of the stages ST1 to STn is coupled to a corresponding one of scan lines S1 to Sn, and supplies a scan signal to the corresponding one of the scan lines S1 to Sn. For example, an ith (i is a natural number) stage STi may be coupled to an ith scan line Si, and may supply a scan signal to the ith scan line Si.

Each of the stages ST1 to STn receives, as a gate shift clock GSC, a corresponding one of clock signals CLK1 and CLK2 supplied from the timing controller 130. For example, odd-numbered stages ST1, ST3, . . . may be driven by the first clock signal CLK1, and even-numbered stages ST2, ST4, . . . may be driven by the second clock signal CLK2.

Figure 3:
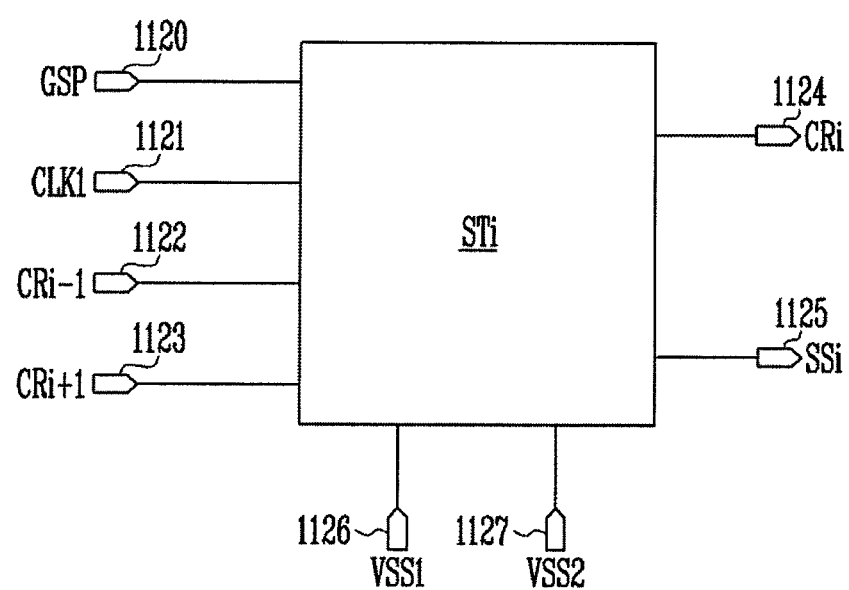
FIG. 3 is a diagram schematically illustrating terminals coupled to a stage.
Figure 9:
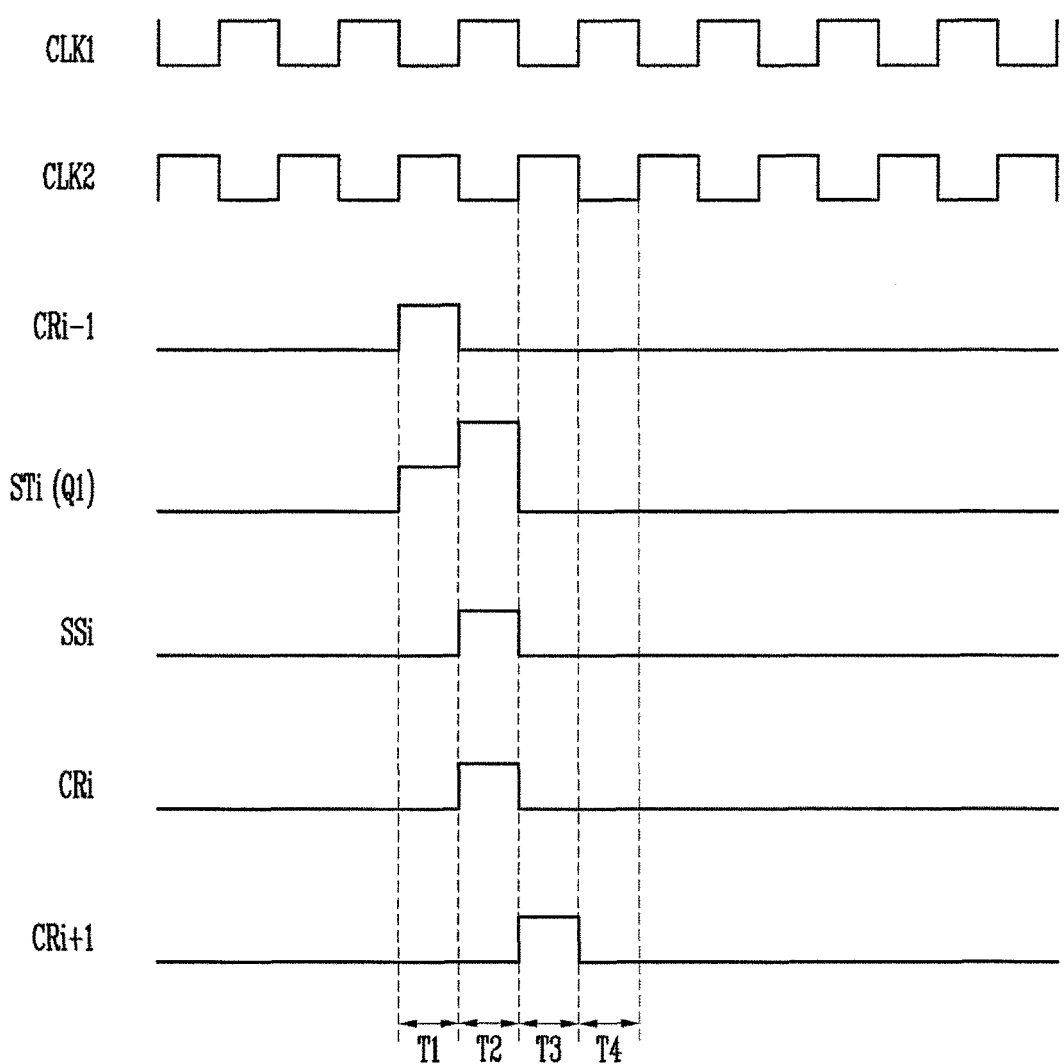
FIG. 9 is a waveform diagram illustrating a driving method of a stage circuit shown in FIG. 5 according to an embodiment of the present disclosure.

The first clock signal CLK1 (e.g., as shown in FIG. 9) may be a square wave signal in which a high voltage and a low voltage are repeated. The high voltage of the first clock signal CLK1 may be set as a gate-on voltage, and the low voltage of the first clock signal CLK1 may be set as a second off voltage VSS2 as shown in FIG. 3.

The second clock signal CLK2 may be a square wave signal in which a high voltage and a low voltage are repeated. The high voltage of the second clock signal CLK2 may be set as a gate-on voltage, and the low voltage of the second clock signal CLK2 may be set as a second off voltage VSS2. Here, the second clock signal CLK2 may have an inverted phase with respect to the first clock signal CLK1.

While it is described above that each of the stages ST1 to STn is driven by one of the clock signal CLK1 or CLK2, the present disclosure is not limited thereto. For example, each of the stages ST1 to STn may be driven by two or more clock signals.

Additionally, each of the stages ST1 to STn is supplied with a gate start pulse GSP. When the gate start pulse GSP is supplied, the stages ST1 to STn are initialized. For example, when the gate start pulse GSP is supplied, each of the stages ST1 to STn may supply a first off voltage VSS1 to the corresponding scan lines S1 to Sn.

Here, the gate start pulse GSP is supplied for every frame when each stage is driven at a normal frequency, and accordingly, the stages ST1 to STn may be initialized for every frame period. Also, the gate start pulse GSP is supplied when each stage is driven at a low frequency. In this case, the stages ST1 to STn maintain or substantially maintain an initialization state. Detailed description thereof will be described in conjunction with circuit structures of the stages ST1 to STn.

The first dummy stage DST1 is used to supply a carry signal to a first stage ST1 (e.g., the first stage). For example, the first dummy stage DST1 is supplied with the gate start pulse GSP and the second clock signal CLK2. The first dummy stage DST1 supplied with the gate start pulse GSP supplies the carry signal to the first stage ST1, corresponding to the second clock signal CLK2.

The second dummy stage DST2 is used to supply a carry signal to an nth stage STn (e.g., the last stage). For example, the second dummy stage DST2 is supplied with the gate start pulse GSP and the first clock signal CLK1.

FIG. 3 is a diagram schematically illustrating terminals coupled to a stage. In FIG. 3, an ith stage STi will be described for convenience of illustration.

Referring to FIG. 3, the ith stage STi includes a first reset input terminal 1120, a first input terminal 1121, a second input terminal 1122, a third input terminal 1123, a first output terminal 1124, a second output terminal 1125, a first power input terminal 1126, and a second power input terminal 1127.

The reset input terminal 1120 is supplied with the gate start pulse GSP.

The first input terminal 1121 is supplied with the first clock signal CLK1. In this case, the second clock signal CLK2 is supplied to a first input terminal 1121 of an (i−1)th stage STi−1.

The second input terminal 1122 is supplied with an (i−1)th carry signal CRi−1 from the (i−1)th stage STi−1.

The third input terminal 1123 is supplied with an (i+1)th carry signal CRi+1 from an (i+1)th stage STi−1.

The first output terminal 1124 supplies a carry signal CRi of the ith stage STi to the previous and next stages STi−1 and STi+1.

The second output terminal 1125 supplies a scan signal SSi of the ith stage STi to an ith scan line Si.

The first power input terminal 1126 is supplied with the first off voltage VSS1, and the second power input terminal 1127 is supplied with the second off voltage VSS2. Here, the second off voltage VSS2 may be set as a voltage lower than that of the first off voltage VSS1. Additionally, the first off voltage VSS1 and the second off voltage VSS2 are used to turn off (e.g., completely turn off) the transistors, but the present disclosure is not limited thereto. For example, the second off voltage VSS2 may be supplied to the first power input terminal 1126 and the second power input terminal 1127.

Figure 4A:
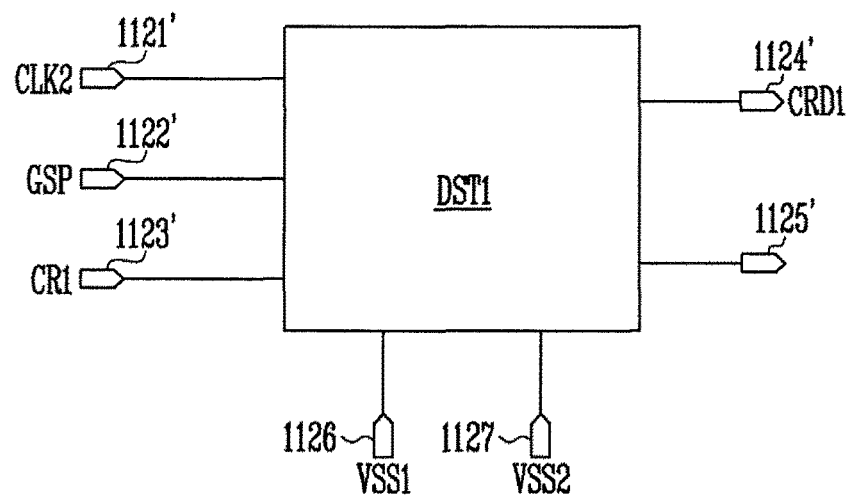
FIG. 4A is a diagram schematically illustrating terminals coupled to a first dummy stage.

FIG. 4A is a diagram schematically illustrating terminals coupled to the first dummy stage. In FIG. 4A, components that are the same or substantially the same as those of FIG. 3 are designated by like reference numerals.

Referring to FIG. 4A, the first dummy stage DST1 includes a first input terminal 1121', a second input terminal 1122', a third input terminal 1123', a first output terminal 1124', a second output terminal 1125', a first power input terminal 1126, and a second power input terminal 1127. As compared with FIG. 3, the components of the first dummy stage DST1 are similar or the same as those of the ith stage STi except that the reset input terminal 1120 is removed.

The first input terminal 1121' is supplied with the second clock signal CLK2.

The second input terminal 1122' is supplied with the gate start pulse GSP.

The third input terminal 1123' is supplied with a first carry signal CR1 from the first stage ST1.

The first output terminal 1124' supplies a first dummy carry signal CRD1 to the first stage ST1.

The second output terminal 1125' is used as a terminal for outputting a scan signal, and is not coupled to a separate scan line. Therefore, the second output terminal 1125' may be omitted when necessary or desired.

The first power input terminal 1126 is supplied with the first off voltage VSS1, and the second power input terminal 1127 is supplied with the second off voltage VSS2.

Figure 4B:
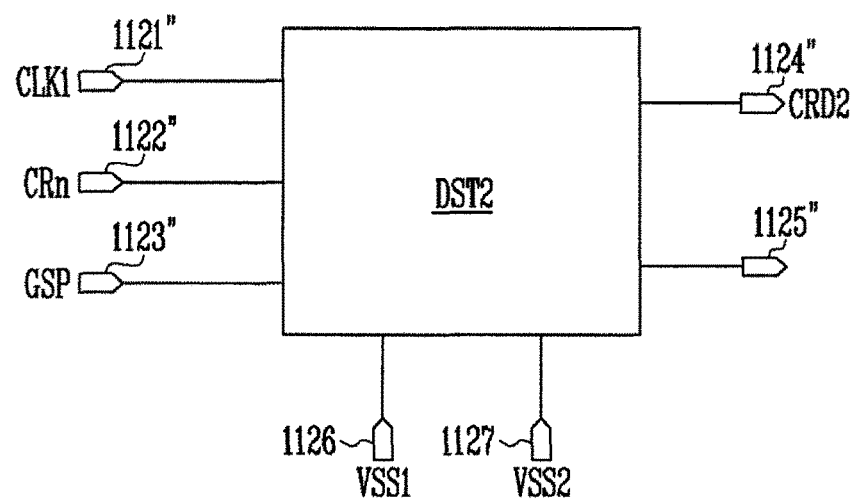
FIG. 4B is a diagram schematically illustrating terminals coupled to a second dummy stage.

FIG. 4B is a diagram schematically illustrating terminals coupled to the second dummy stage. In FIG. 4B, components that are the same or substantially the same as those of FIG. 3 are designated by like reference numerals.

Referring to FIG. 4B, the second dummy stage DST2 includes a first input terminal 1121", a second input terminal 1122", a third input terminal 1123", a first output terminal 1124", a second output terminal 1125", a first power input terminal 1126, and a second power input terminal 1127. As compared with FIG. 3, the components of the second dummy stage DST2 are similar or the same as those of the ith stage STi except that the reset input terminal 1120 is removed.

The first input terminal 1121" is supplied with the first clock signal CLK1.

The second input terminal 1122" is supplied with an nth carry signal CRn from the nth stage STn.

The third input terminal 1123" is supplied with the gate start pulse GSP.

The first output terminal 1124" supplies a second dummy carry signal CRD2 to the nth stage STn.

The second output terminal 1125" is used as a terminal for outputting a scan signal, and is not coupled to a separate scan line. Therefore, the second output terminal 1125" may be omitted when necessary or desired.

The first power input terminal 1126 is supplied with the first off voltage VSS1, and the second power input terminal 1127 is supplied with the second off voltage VSS2.

Figure 5:
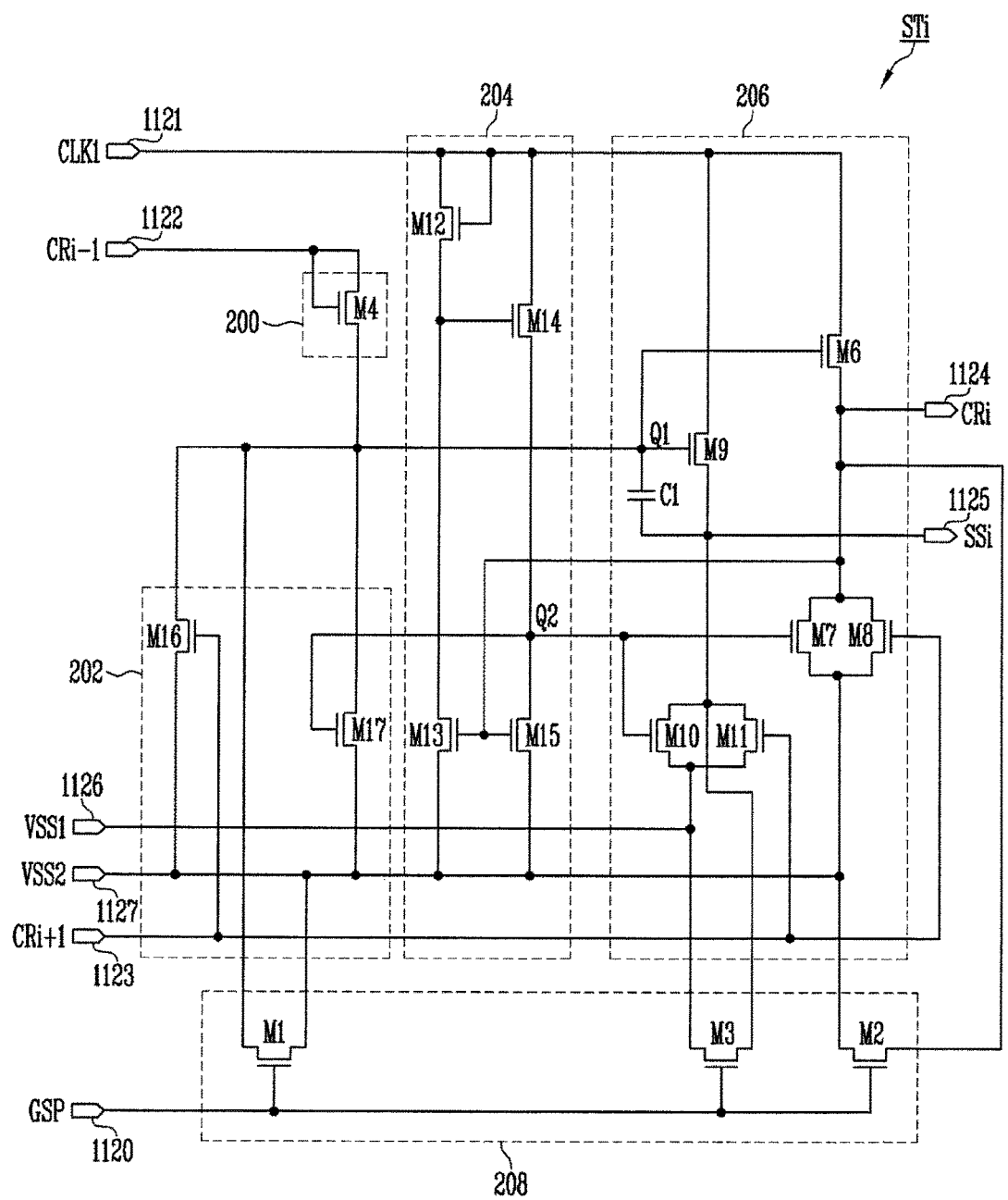
FIG. 5 is a circuit diagram illustrating the stage shown in FIG. 3 according to an embodiment of the present disclosure.

FIG. 5 is a circuit diagram illustrating the stage shown in FIG. 3 according to an embodiment of the present disclosure.

Referring to FIG. 5, the stage STi according to an embodiment of the present disclosure includes a pull-up unit 200, a pull-down unit 202, a controller 204, an output unit 206, and a reset unit 208.

The pull-up unit 200 controls a voltage of a first node Q1 (e.g., a Q node), corresponding to the (i−1)th carry signal CRi−1. The pull-up unit 200 includes a fourth transistor M4.

A first electrode and a gate electrode of the fourth transistor M4 are coupled to the second input terminal 1122, and a second electrode of the fourth transistor M4 is coupled to the first node Q1. That is, the fourth transistor M4 is coupled in a diode form (e.g., diode-coupled), and is turned on when the (i−1)th carry signal CRi−1 is supplied to the second input terminal 1122.

The output unit 206 outputs a carry signal CRi to the first output terminal 1124, and outputs a scan signal SSi to the second output terminal 1125, corresponding to the first clock signal CLK1 supplied to the first input terminal 1121, the (i+1)th carry signal CRi+1 supplied to the third input terminal 1123, and voltages of the first node Q1 and a second node Q2 (e.g., a Qb node). The output unit 206 includes sixth to eleventh transistors M6 to M11 and a first capacitor C1.

A first electrode of the sixth transistor M6 is coupled to the first input terminal 1121, and a second electrode of the sixth transistor M6 is coupled to the first output terminal 1124. In addition, a gate electrode of the sixth transistor M6 is coupled to the first node Q1. The sixth transistor M6 controls coupling between the first input terminal 1121 and the first output terminal 1124, while being turned on/off corresponding to the voltage of the first node Q1.

A first electrode of the seventh transistor M7 is coupled to the first output terminal 1124, and a second electrode of the seventh transistor M7 is coupled to the second power input terminal 1127. In addition, a gate electrode of the seventh transistor M7 is coupled to the second node Q2. The seventh transistor M7 controls coupling between the first output terminal 1124 and the second power input terminal 1127, while being turned on/off corresponding to the voltage of the second node Q2.

A first electrode of the eighth transistor M8 is coupled to the first output terminal 1124, and a second electrode of the eighth transistor M8 is coupled to the second power input terminal 1127. In addition, a gate electrode of the eighth transistor M8 is coupled to the third input terminal 1123. The eighth transistor M8 is turned on when the (i+1)th carry signal CRi+1 is supplied to the third input terminal 1123, to allow the first output terminal 1124 and the second power input terminal 1127 to be electrically coupled to each other.

A first electrode of the ninth transistor M9 is coupled to the first input terminal 1121, and a second electrode thereof is coupled to the second output terminal 1125. In addition, a gate electrode of the ninth transistor M9 is coupled to the first node Q1. The ninth transistor M9 controls coupling between the first input terminal 1121 and the second output terminal 1125, while being turned on/off corresponding to the voltage of the first node Q1.

A first electrode of the tenth transistor M10 is coupled to the second output terminal 1125, and a second electrode of the tenth transistor M10 is coupled to the first power input terminal 1126. In addition, a gate electrode of the tenth transistor M10 is coupled to the second node Q2. The tenth transistor M10 controls coupling between the second output terminal 1125 and the first power input terminal 1126, while being turned on/off corresponding to the voltage of the second node Q2.

A first electrode of the eleventh transistor M11 is coupled to the second output terminal 1125, and a second electrode of the eleventh transistor M11 is coupled to the first power input terminal 1126. In addition, a gate electrode of the eleventh transistor M11 is coupled to the third input terminal 1123. The eleventh transistor M11 is turned on when the (i+1)th carry signal CRi+1 is supplied to the third input terminal 1123, to allow the second output terminal 1125 and the first power input terminal 1126 to be electrically coupled to each other.

The first capacitor C1 is coupled between the first node Q1 and the second output terminal 1125. The first capacitor C1 functions as a boosting capacitor. In other words, the first capacitor C1 increases the voltage of the first node Q1, corresponding to an increase in the voltage of the second output terminal 1125, and accordingly, allows the ninth transistor M9 to maintain (e.g., stably maintain) or substantially maintain a turn-on state.

The controller 204 controls the voltage of the second node Q2, corresponding to the first clock signal CLK1 supplied to the first input terminal 1121. The controller 204 includes twelfth to fifteenth transistors M12 to M15.

A first electrode and a gate electrode of the twelfth transistor M12 are coupled to the first input terminal 1121, and a second electrode of the twelfth transistor M12 is coupled to a first electrode of the thirteenth transistor M13 and a gate electrode of the fourteenth transistor M14. The twelfth transistor M12 is coupled in a diode form (e.g., diode-coupled), and is turned on when the first clock signal CLK1 is supplied to the first input terminal 1121.

The first electrode of the thirteenth transistor M13 is coupled to the second electrode of the twelfth transistor M12, and a second electrode of the thirteenth transistor M13 is coupled to the second power input terminal 1127. In addition, a gate electrode of the thirteenth transistor M13 is coupled to the first output terminal 1124. The thirteenth transistor M13 is turned on when the carry signal CRi is supplied to the output terminal 1124.

A first electrode of the fourteenth transistor M14 is coupled to the first input terminal 1121, and a second electrode of the fourteenth transistor M14 is coupled to the second node Q2. In addition, the gate electrode of the fourteenth transistor M14 is coupled to the second electrode of the twelfth transistor M12. The fourteenth transistor M14 controls coupling between the first input terminal 1121 and the second node Q2, while being turned on/off corresponding to a voltage supplied from the twelfth transistor M12.

A first electrode of the fifteenth transistor M15 is coupled to the second node Q2, and a second electrode of the fifteenth transistor M15 is coupled to the second power input terminal 1127. In addition, a gate electrode of the fifteenth transistor M15 is coupled to the first output terminal 1124. The fifteenth transistor M15 is turned on when the carry signal CRi is supplied to the first output terminal 1124.

The pull-down unit 202 controls the voltage of the first node Q1, corresponding to the (i+1)th carry signal CRi+1 supplied to the third input terminal 1123 and corresponding to the voltage of the second node Q2. The pull-down unit 202 includes a sixteenth transistor M16 and a seventeenth transistor M17.

The sixteenth transistor M16 is coupled between the first node Q1 and the second power input terminal 1127. In addition, a gate electrode of the sixteenth transistor M16 is coupled to the third input terminal 1123. The sixteenth transistor M16 is turned on when the (i+1)th carry signal CRi+1 is supplied to the third input terminal 1123, to allow the first node Q1 and the second power input terminal 1127 to be electrically coupled to each other.

The seventeenth transistor M17 is coupled between the first node Q1 and the second power input terminal 1127. In addition, a gate electrode of the seventeenth transistor M17 is coupled to the second node Q2. The seventeenth transistor M17 controls electrical coupling between the first node Q1 and the second power input terminal 1127, while being turned on/off corresponding to the voltage of the second node Q2.

The reset unit 208 initializes voltages of the first node Q1, the first output terminal 1124, and the second output terminal 1125, corresponding to the gate start pulse GSP supplied to the reset input terminal 1120. The reset unit 208 includes a first transistor M1, a second transistor M2, and a third transistor M3.

The first transistor M1 is coupled between the first node Q1 and the second power input terminal 1127. In addition, a gate electrode of the first transistor M1 is coupled to the reset input terminal 1120. The first transistor M1 is turned on when the gate start pulse GSP is supplied to the reset input terminal 1120, to allow the first node Q1 and the second power input terminal 1127 to be electrically coupled to each other.

The second transistor M2 is coupled between the first output terminal 1124 and the second power input terminal 1127. In addition, a gate electrode of the second transistor M2 is coupled to the reset input terminal 1120. The second transistor M2 is turned on when the gate start pulse GSP is supplied to the reset input terminal 1120, to allow the first output terminal 1124 and the second power input terminal 1127 to be electrically coupled to each other.

The third transistor M3 is coupled between the second output terminal 1125 and the first power input terminal 1126. In addition, a gate electrode of the third transistor M3 is coupled to the reset input terminal 1120. The third transistor M3 is turned on when the gate start pulse GSP is supplied to the reset input terminal 1120, to allow the second output terminal 1125 and the first power input terminal 1126 to be electrically coupled to each other.

That is, according to one or more example embodiments of the present disclosure, when the gate start pulse GSP is supplied, the reset unit 208 supplies the second off voltage VSS2 to the first node Q1 and the first output terminal 1124, and supplies the first off voltage VSS1 to the second output terminal 1125. Thus, all the stages ST1 to STn are set to the initialization state when the gate start pulse GSP is supplied.

When the display device is driven at a normal frequency, the gate start pulse GSP is supplied for every frame period, and accordingly, the reliability of the reset unit 208 may be ensured.

For example, when the first to third transistors M1 to M3 maintain or substantially maintain a turn-off state, an off stress is applied to the first to third transistors M1 to M3. When the off stress is applied (e.g., continuously applied) to NMOS transistors (formed of, for example, an oxide semiconductor), such as those of the first to third transistors M1 to M3, current characteristics including a threshold voltage may be changed. That is, when the first to third transistors M1 to M3 maintain or substantially maintain the turn-off state for a period (e.g., a predetermined period), the reliability of the stage ST is lowered.

According to one or more example embodiments of the present disclosure, the gate start pulse GSP is supplied to the reset input terminal 1120. When the gate start pulse GSP is supplied to the reset input terminal 1120, the first to third transistors M1 to M3 are set to the turn-on state for every frame (e.g., turned on and off at least once per frame), and accordingly, a change in characteristics may be reduced or minimized. That is, according to one or more example embodiments of the present disclosure, the first to third transistors M1 to M3 are set to the turn-on state for every frame period (e.g., turned on and off at least once per frame period), and accordingly, the reliability of an operation may be ensured.

Additionally, the circuit configurations of the pull-up unit 200, the pull-down unit 202, the controller 204, and the output unit 206, shown in FIG. 5, is not limited thereto. For example, according to one or more example embodiments of the present disclosure, the stage ST may be implemented with various suitable circuits, such that the reset unit 208 is included in the stage ST.

Figure 6:
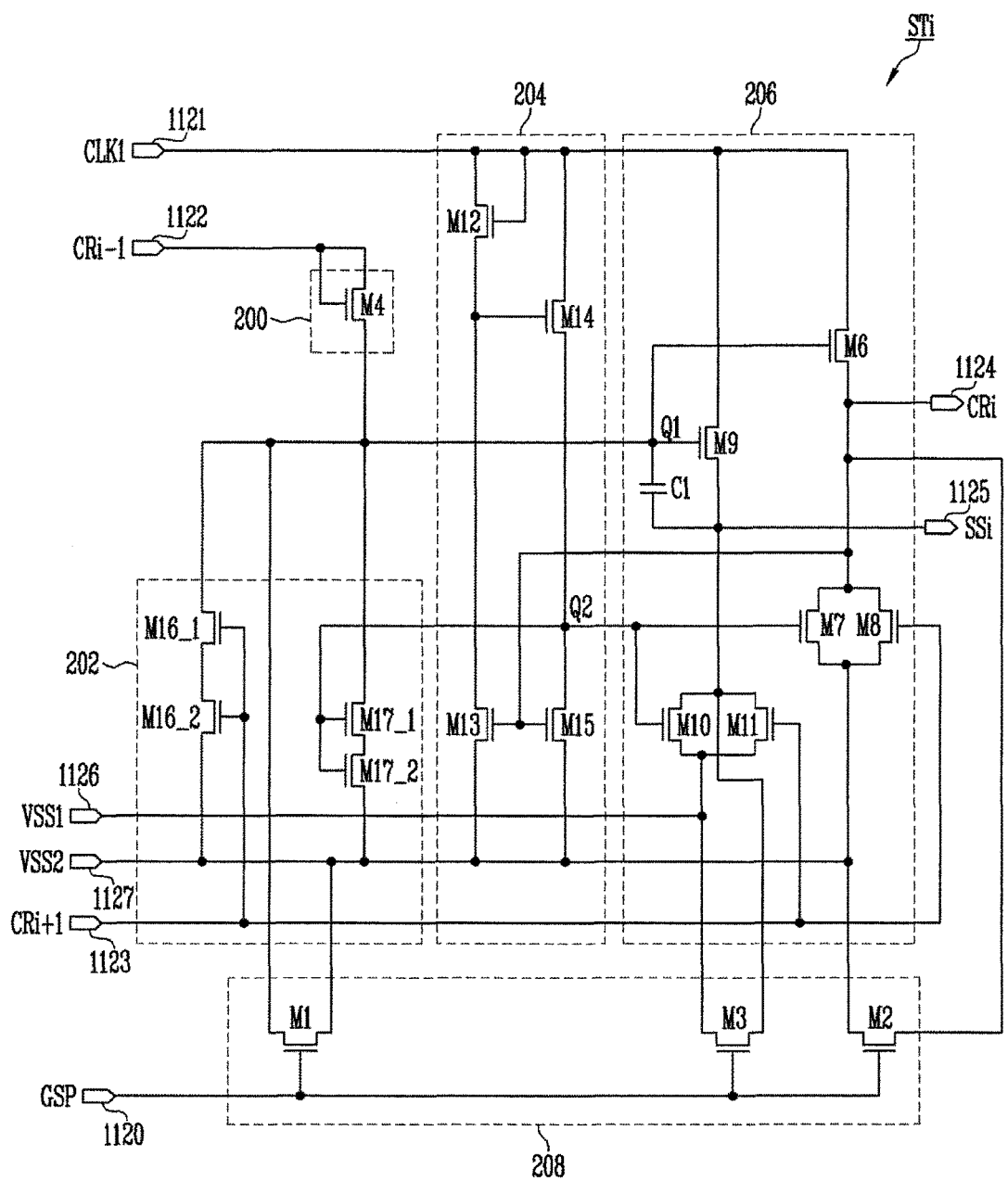
FIG. 6 is a circuit diagram illustrating the stage shown in FIG. 3 according to another embodiment of the present disclosure.

FIG. 6 is a circuit diagram illustrating the stage shown in FIG. 3 according to another example embodiment of the present disclosure. In FIG. 6, components that are the same or substantially the same as those of FIG. 5 are designated by like reference numerals, and detailed descriptions thereof will not be provided again.

Referring to FIG. 6, in the stage STi according to an embodiment of the present disclosure, a sixteenth transistor M16_1 and M16_2 and a seventeenth transistor M17_1 and M17_2, which are included in the pull-down unit 202, include a plurality of transistors.

The sixteenth transistor M16_1 and M16_2 is configured such that a plurality of transistors are coupled in series between the first node Q1 and the second power input terminal 1127. When the sixteenth transistor M16_1 and M16_2 is configured with a plurality of transistors, the voltage between the first node Q1 and the second power input terminal 1127 is divided, thereby improving lifespan characteristics.

The seventeenth transistor M17_1 and M17_2 is configured such that a plurality of transistors are coupled in series between the first node Q1 and the second power input terminal 1127. When the seventeenth transistor M17_1 and M17_2 is configured with a plurality of transistors, the voltage between the first node Q1 and the second power input terminal 1127 is divided, thereby improving lifespan characteristics.

Figure 7:
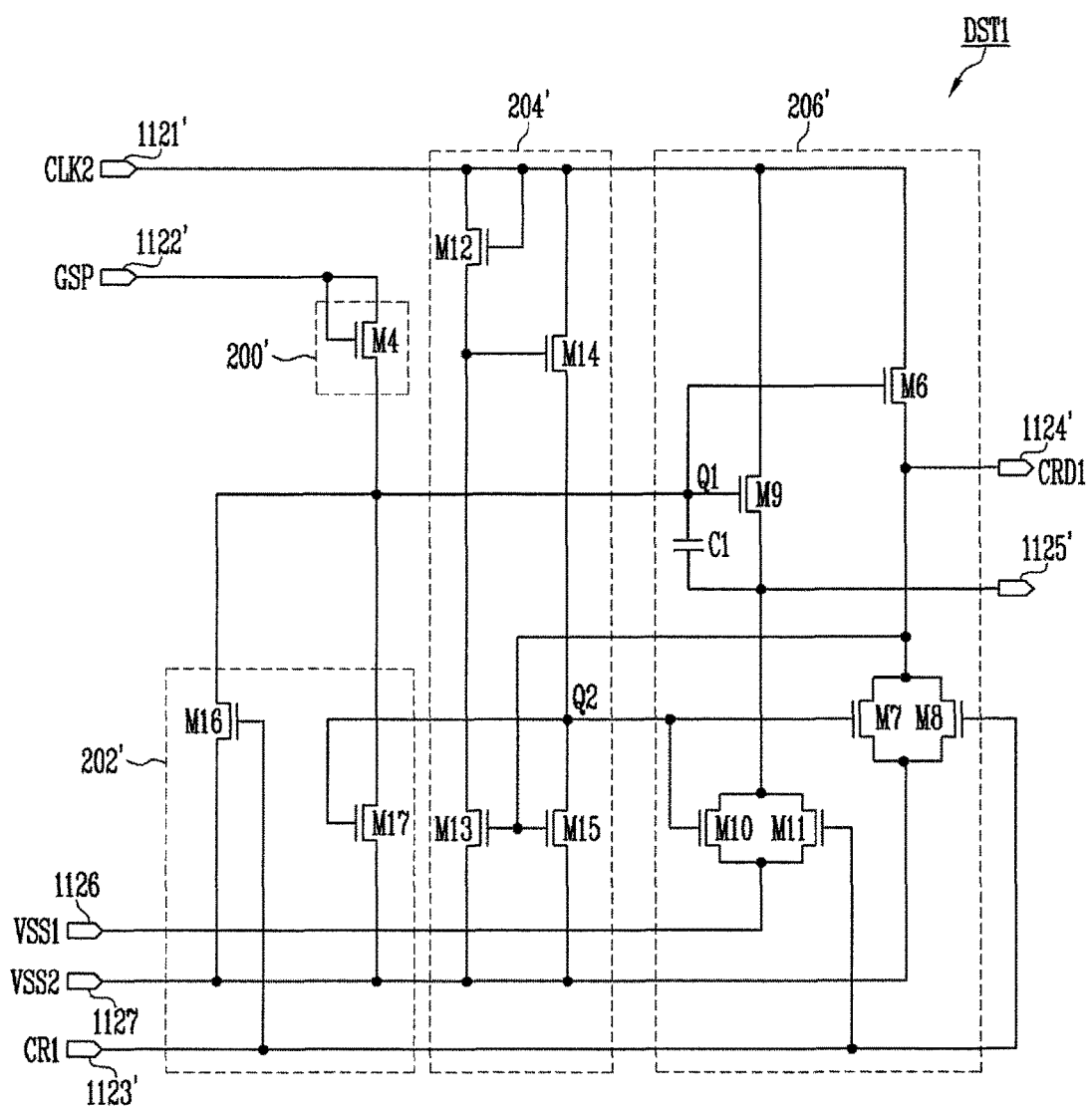
FIG. 7 is a circuit diagram illustrating the first dummy stage shown in FIG. 4A according to an embodiment of the present disclosure.

FIG. 7 is a circuit diagram illustrating the first dummy stage shown in FIG. 4A according to an example embodiment of the present disclosure. In FIG. 7, detailed descriptions of components that are the same or substantially the same as those of FIG. 5 will not be provided again.

Referring to FIG. 7, the first dummy stage DST1 according to an embodiment of the present disclosure includes a pull-up unit 200', a pull-down unit 202', a controller 204', and an output unit 206'. The components of the first dummy stage DST1 are configured to be the same or substantially the same as those of the stage STi of FIG. 5, except that the reset unit 290 is not included in the first dummy stage DST1.

In other words, the circuit configurations of the pull-up unit 200', the pull-down unit 202', the controller 204', and the output unit 206' of the first dummy stage DST1 are the same or substantially the same as those of the pull-up unit 200, the pull-down unit 202, the controller 204, and the output unit 206 of the stage STi shown in FIG. 5.

Additionally, the second clock signal CLK2 is supplied to the first input terminal 1121', the gate start pulse GSP is supplied to the second input terminal 1122', and the first carry signal CR1 from the first stage ST1 is supplied to the third input terminal 1123'.

The first dummy stage DST1 supplies the first dummy carry signal CRD1 to the first stage ST1, corresponding to the gate start pulse GSP supplied to the second input terminal 1122'. Then, the stages ST1 to STn supply (e.g., sequentially supply) scan signals SS1 to SSn to the scan lines S1 to Sn, corresponding to the first dummy carry signal CRD1.

Figure 8:
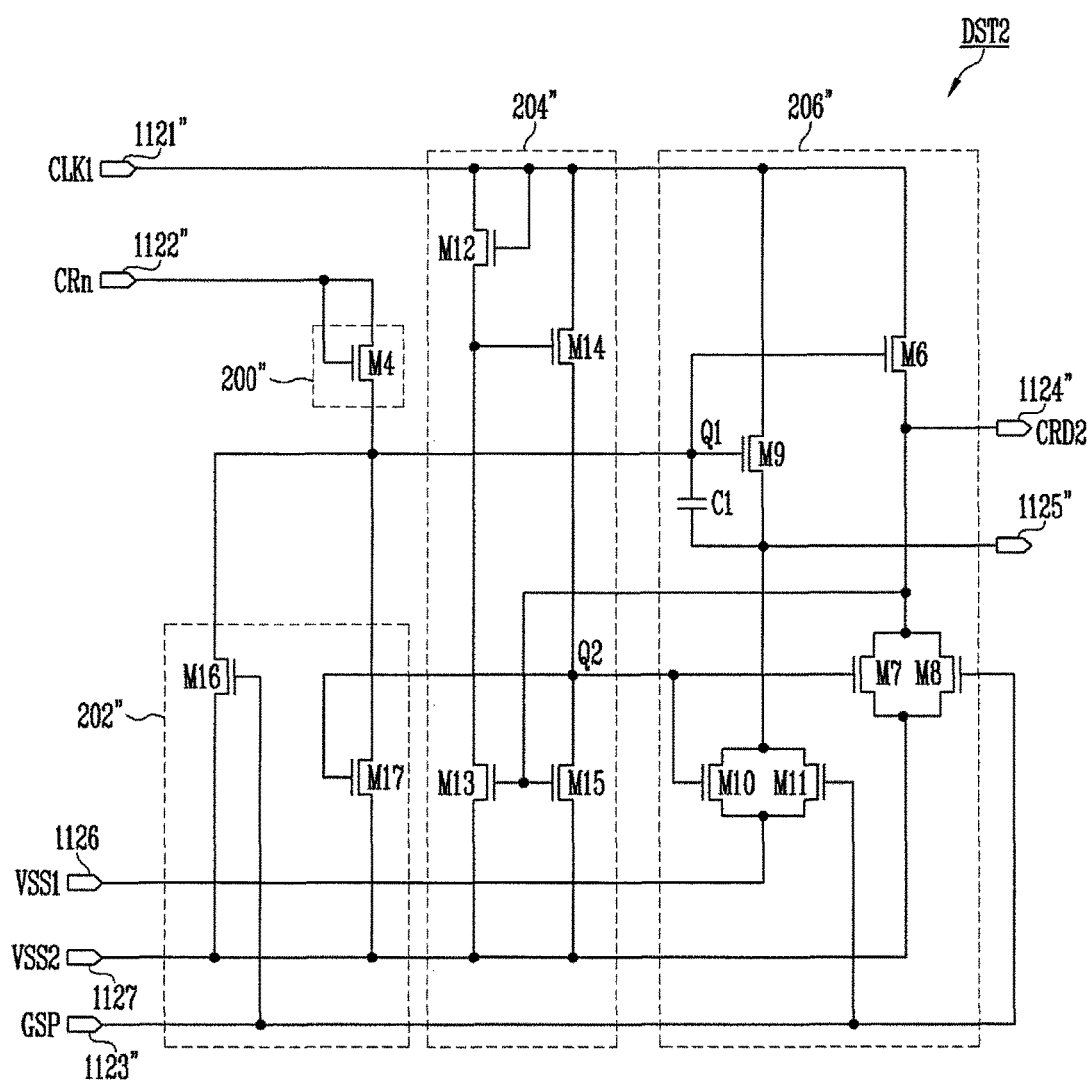
FIG. 8 is a circuit diagram illustrating the second dummy stage shown in FIG. 4B according to an embodiment of the present disclosure.

FIG. 8 is a circuit diagram illustrating the second dummy stage shown in FIG. 4B according to an example embodiment of the present disclosure. In FIG. 8, detailed descriptions of components that are the same or substantially the same as those of FIG. 5 will not be provided again.

Referring to FIG. 8, the second dummy stage DST2 according to an embodiment of the present disclosure includes a pull-up unit 200", a pull-down unit 202", a controller 204", and an output unit 206". The components of the second dummy stage DST2 are configured to be the same or substantially the same as those of the stage STi of FIG. 5, except that the reset unit 208 is not included in the second dummy stage DST2.

In other words, the circuit configurations of the pull-up unit 200", the pull-down unit 202", the controller 204", and the output unit 206" of the second dummy stage DST2 are the same or substantially the same as those of the pull-up unit 200, the pull-down unit 204, the controller 204, and the output unit 206 of the stage STi shown in FIG. 5.

Additionally, the first clock signal CLK1 is supplied to the first input terminal 1121", the nth carry signal CRn from the nth stage STn is supplied to the second input terminal 1122", and the gate start pulse GSP is supplied to the third input terminal 1123".

The second dummy stage DST2 supplies the second dummy carry signal CRD2 to the nth stage STn, corresponding to the nth carry signal CRn supplied to the second input terminal 1122". In addition, the second dummy stage DST2 is initialized when the gate start pulse GSP is supplied to the third input terminal 1123".

FIG. 9 is a waveform diagram illustrating a driving method of a stage circuit shown in FIG. 5 according to an embodiment of the present disclosure. In FIG. 9, the supply of a clock signal, a carry signal, and the like refers to a gate-on voltage, and the stop of the supply of the clock signal, the carry signal, and the like refers to a gate-off voltage.

Referring to FIGS. 5 and 9, the (i−1)th carry signal CRi−1 is supplied to the second input terminal 1122 during a first period T1. When the (i−1)th carry signal CRi−1 is supplied, the fourth transistor M4 is turned on. When the fourth transistor M4 is turned on, the (i−1)th carry signal CRi−1 is supplied to the first node Q1. When the (i−1)th carry signal CRi−1 is supplied to the first node Q1, the sixth transistor M6 and ninth transistor M9 are turned on. When the sixth transistor M6 and ninth transistor M9 are turned on, the first output terminal 1124, the second output terminal 1125, and the first input terminal 1121 are electrically connected to each other.

The first clock signal CLK1 is supplied to the first input terminal 1121 during a second period T2. In this case, the sixth transistor M6 and the ninth transistor M9 are set in the turn-on state, and hence the first clock signal CLK1 supplied to the first input terminal 1121 is supplied to the first output terminal 1124 and the second output terminal 1125. The first clock signal CLK1 supplied to the first output terminal 1124 is output as the ith carry signal CRi. The first clock signal CLK1 supplied to the second output terminal 1125 is supplied as the scan signal SSi to the scan line Si.

Meanwhile, the voltage of the first node Q1 is increased to a voltage higher than that of the first clock signal CLK1 by the boosting of the first capacitor C1 during the second period T2. Accordingly, the sixth transistor M6 and the ninth transistor M9 maintain (e.g., stably maintain) or substantially maintain the turn-on state.

Also, the thirteenth transistor M13 and the fifteenth transistor M15 are turned on by the ith carry signal CRi supplied to the first output terminal 1124 during the second period T2. When the thirteenth transistor M13 is turned on, the second off voltage VSS2 is supplied to the gate electrode of the fourteenth transistor M14. When the fifteenth transistor M15 is turned on, the second off voltage VSS2 is supplied to the second node Q2. Thus, the voltage of the second node Q2 is set as the second off voltage VSS2 during the second period T2, and accordingly, the seventh transistor M7, the tenth transistor M10, and the seventeenth transistor M17 maintain or substantially maintain the turn-off state.

Meanwhile, when the first clock signal CLK1 is supplied to the first input terminal 1121 during the second period 12, the twelfth transistor M12 is turned on. Here, the twelfth transistor M12 is coupled in a diode form (e.g., diode-coupled). Thus, when the twelfth transistor M12 and the thirteenth transistor M13 have channel widths that are the same or substantially the same to each other, the voltage of the gate electrode of the fourteenth transistor M14 is dropped to the second off voltage VSS2. Although the fourteenth transistor M14 is turned-on, the fifteenth transistor M15 may allow the second node Q2 to maintain (e.g., stably maintain) or substantially maintain the second off voltage VSS2.

The (i+1)th carry signal CRi+1 is supplied to the third input terminal 1123 during a third period T3. When the (i+1)th carry signal CRi+1 is supplied, the eighth transistor M8, the eleventh transistor M11, and the sixteenth transistor M16 are turned on.

When the eleventh transistor M11 is turned on, the first off voltage VSS1 from the first power input terminal 1126 is supplied to the second output terminal 1125. When the eighth transistor M8 is turned on, the second off voltage VSS2 from the second power input terminal 1127 is supplied to the first output terminal 1124.

When the sixteenth transistor M16 is turned on, the second off voltage VSS2 is supplied to the first node Q1. When the second off voltage VSS2 is supplied to the first node Q1, the sixth transistor M6 and the ninth transistor M9 are turned off. In this case, the second off voltage VSS2 is supplied to the gate electrode of the ninth transistor M9, and the first off voltage VSS1 that is higher than the second off voltage VSS2 is supplied to the second electrode of the ninth transistor M9. Thus, the ninth transistor M9 can be set in the turn-off state (e.g., completely turn-off state) during the third period T3.

The first clock signal CLK1 is supplied to the first input terminal 1121 during a fourth period T4. When the first clock signal CLK1 is supplied to the first input terminal 1121, the twelfth transistor M12 and the fourteenth transistor M14 are turned on. When the twelfth transistor M12 and the fourteenth transistor M14 are turned on, the first clock signal CLK1 is supplied to the second node Q2. When the first clock signal CLK1 is supplied to the second node Q2, the seventh transistor M7, the tenth transistor M10, and the seventeenth transistor M17 are turned on.

When the seventh transistor M7 is turned on, the second off voltage VSS2 is supplied to the first output terminal 1124. When the tenth transistor M10 is turned on, the first off voltage VSS1 is supplied to the second output terminal 1125. When the seventeenth transistor M17 is turned on, the second off voltage VSS2 is supplied to the first node Q1.

When the second off voltage VSS2 is supplied to the first node Q1, the sixth transistor M6 and the ninth transistor M9 are set in the turn-off state.

Each of the stages ST1 to STn outputs a scan signal SS and a carry signal CR, corresponding to the above-described first to fourth periods T1 to T4. Also, the dummy stages DST1 and DST2 having the same or substantially the same circuit configuration as that of the stages ST1 to STn, except for the reset unit 208, are driven corresponding to the above-described first to fourth periods T1 to T4. Therefore, detailed description of a driving process of the dummy stages DST1 and DST2 will not be provided again.

Figure 10:
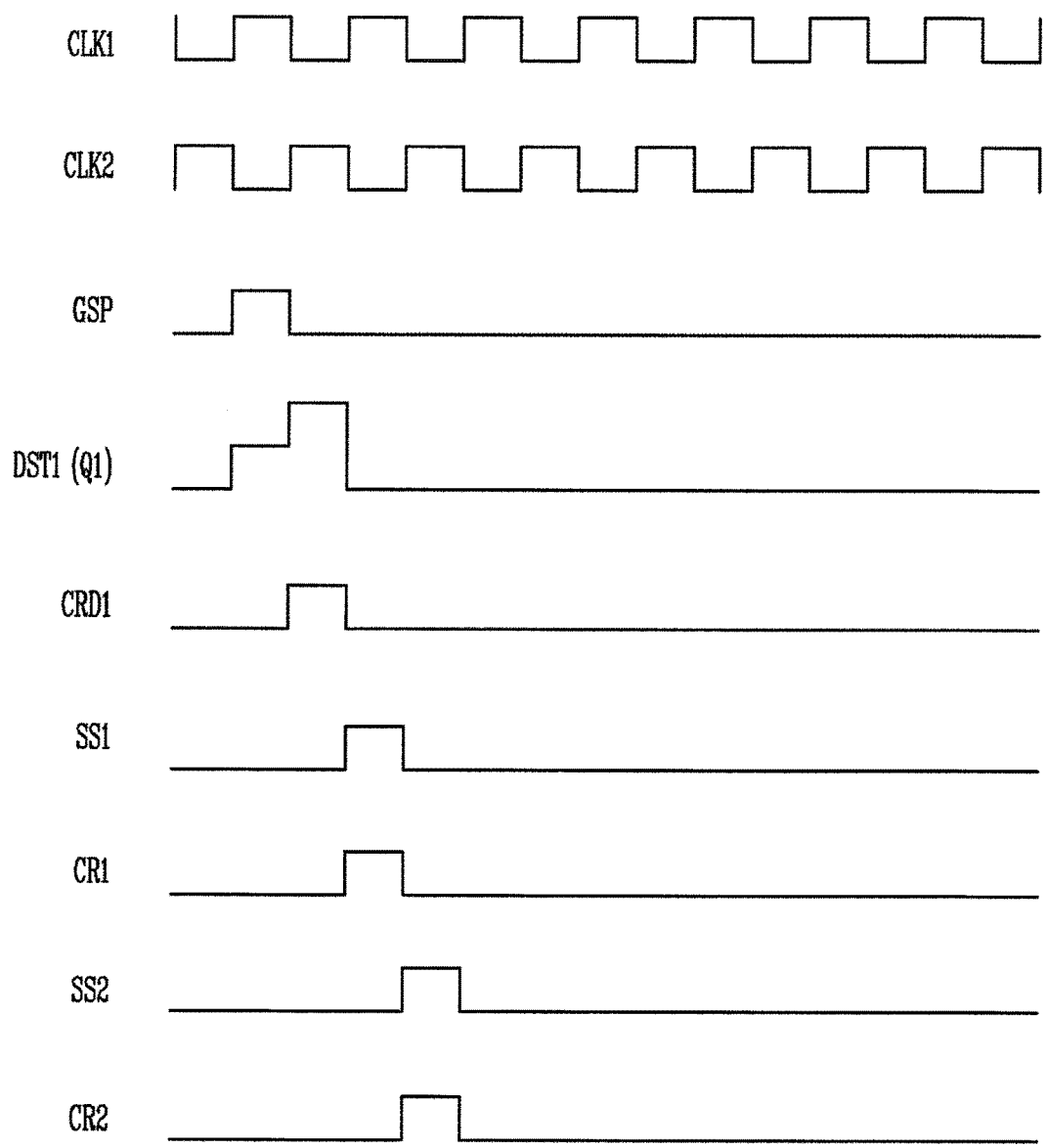
FIG. 10 is a waveform diagram illustrating an operation of the scan driver when the display device is driven at a normal frequency.

FIG. 10 is a waveform diagram illustrating an operation of the scan driver when the display device is driven at a normal frequency.

Referring to FIG. 10, when the display device is driven at a normal frequency, the gate start pulse GSP is supplied to the dummy stages DST1 and DST2 and the stages ST1 to STn for every frame period (e.g., at least one per frame period).

When the gate start pulse GSP is supplied to the stages ST1 to STn, the first to third transistors M1 to M3 included in the reset unit 208 are turned on, and accordingly, the stages ST1 to STn are initialized. Additionally, when the first to third transistors M1 to M3 are turned on corresponding to the gate start pulse GSP, it may be possible to minimize or reduce a change in characteristics of the transistors M1 to M3, thereby improving reliability.

Figure 11:
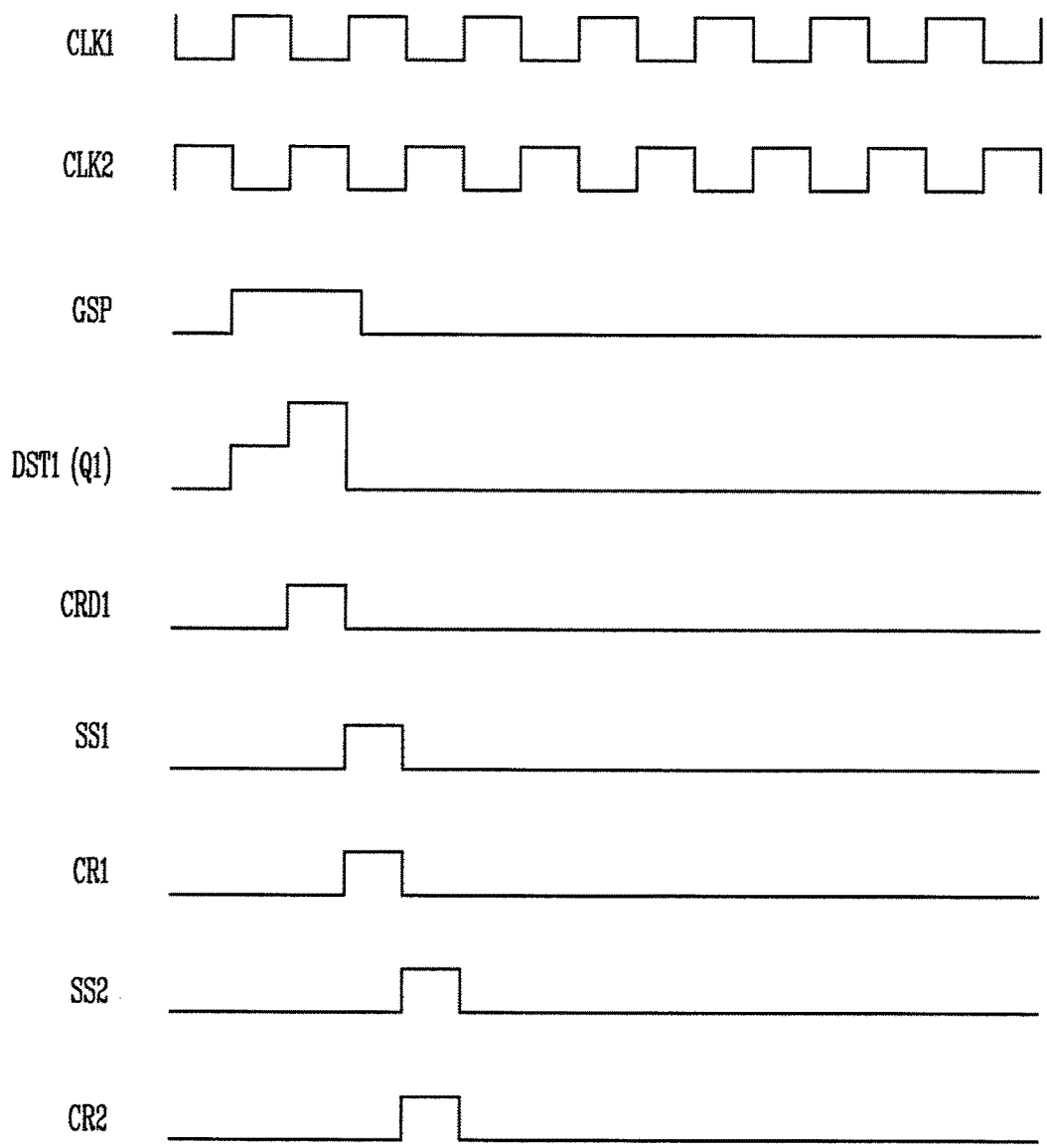
FIG. 11 is a waveform diagram illustrating a gate start pulse shown in FIG. 10 according to another embodiment of the present disclosure.

According to one or more example embodiments of the present disclosure, the gate start pulse GSP (e.g., as shown in FIG. 11) may have a width that is greater than or equal to a half period of the clock signal CLK1 or CLK2. Then, the turn-on time of the first to third transistors M1 to M3 is increased, and accordingly, it may be possible to minimize or reduce a change in characteristic of the first to third transistors M1 to M3.

The gate start pulse GSP is supplied to the third input terminal 1123" of the second dummy stage DST2. When the gate start pulse GSP is supplied to the third input terminal 1123", the eighth transistor M8, the eleventh transistor M11, and the sixteenth transistor M16, which are included in the second dummy stage DST2, are turned on, and accordingly, the second dummy stage DST2 is initialized.

The gate start pulse GSP is supplied to the second input terminal 1122' of the first dummy stage DST1. When the gate start pulse GSP is supplied to the second input terminal 1122', the first dummy stage DST1 supplies the first dummy carry signal CRD1 to the first stage ST1 corresponding to the gate start pulse GSP.

The first stage ST1 supplied with the first dummy carry signal CRD1 outputs a first carry signal CR1 and a first scan signal SS1. The second stage ST2 supplied with the first carry signal CR1 outputs a second carry signal CR2 and a second scan signal SS2. For example, the stages ST1 to STn may sequentially output a carry signal CR and a scan signal SS.

Then, scan signals SS1 to SSn are supplied (e.g., sequentially supplied) to the scan lines S1 to Sn, while the display device is being driven at the normal frequency. In this case, the pixels store a voltage corresponding to a data signal and corresponding to the scan signal, and emits light having a luminance (e.g., a predetermined luminance) corresponding to the stored voltage.

Figure 12:
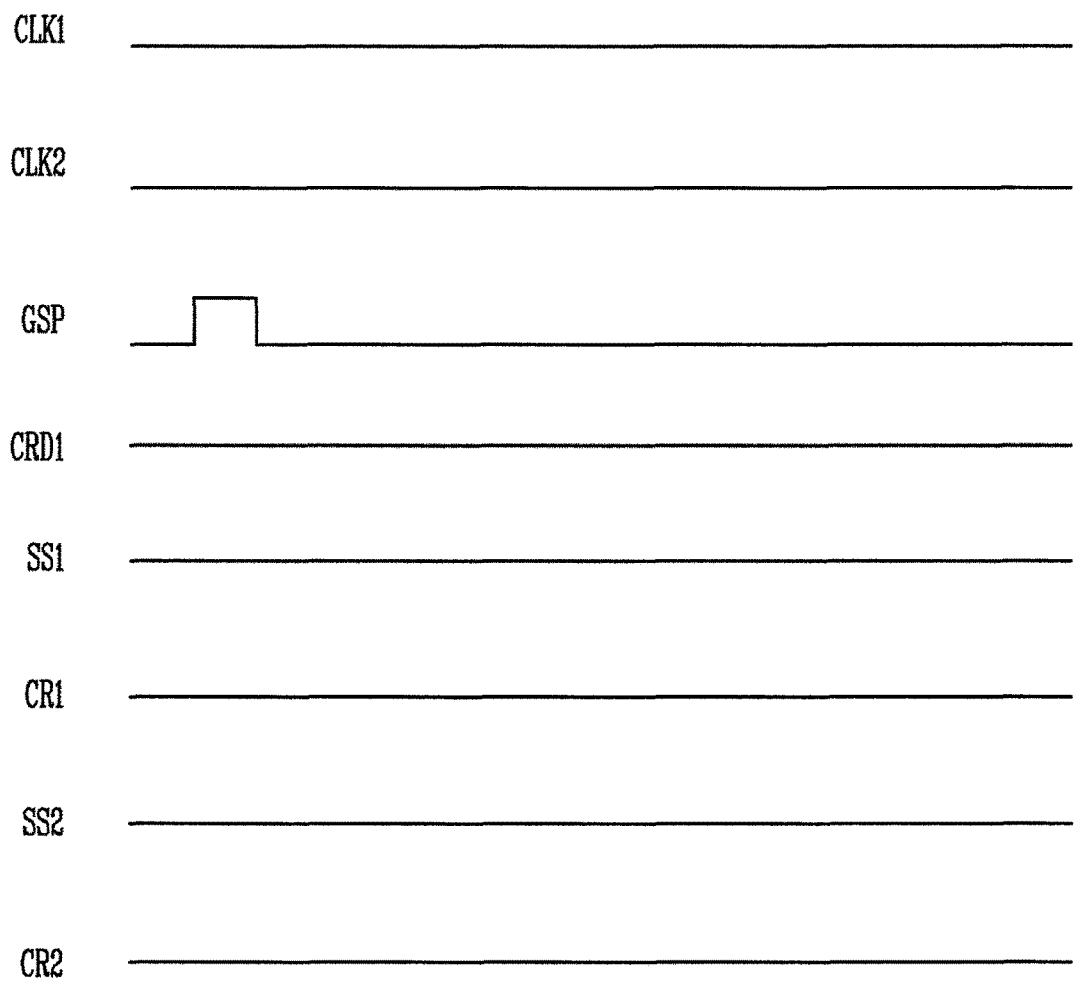
FIG. 12 is a waveform diagram illustrating an operation of the scan driver when the display device is driven at a low frequency.

FIG. 12 is a waveform diagram illustrating an operation of the scan driver when the display device is driven at a low frequency.

Referring to FIG. 12, when the display device is driven at a low frequency, the clock signals CLK1 and CLK2 maintain or substantially maintain the gate-off voltage (e.g., the second off voltage VSS2). The gate start pulse GSP is supplied to the dummy stages DST1 and DST2 and the stages ST1 to STn during the period in which the display device is driven at the low frequency.

When the clock signals CLK1 and CLK2 are not supplied, the dummy carry signals CRD1 and CRD2 are not generated by the dummy stages DST1 and DST2 regardless of the gate start pulse GSP, and the carry signal CR and the scan signal SS are not generated by the stages ST1 to STn regardless of the gate start pulse GSP.

When the gate start pulse GSP is supplied, the first to third transistors M1 to M3 included in the reset unit 208 of each of the stages ST1 to STn are turned on. Then, the stages ST1 to STn are initialized, and accordingly, the stages ST1 to STn maintain or substantially maintain the initialization state.

That is, when the display device is driven at the low frequency, the scan signals SS1 to SSn are not supplied to the scan lines S1 to Sn. Then, the pixels are driven corresponding to the voltage of a data signal charged during a previous period.

Figure 13:
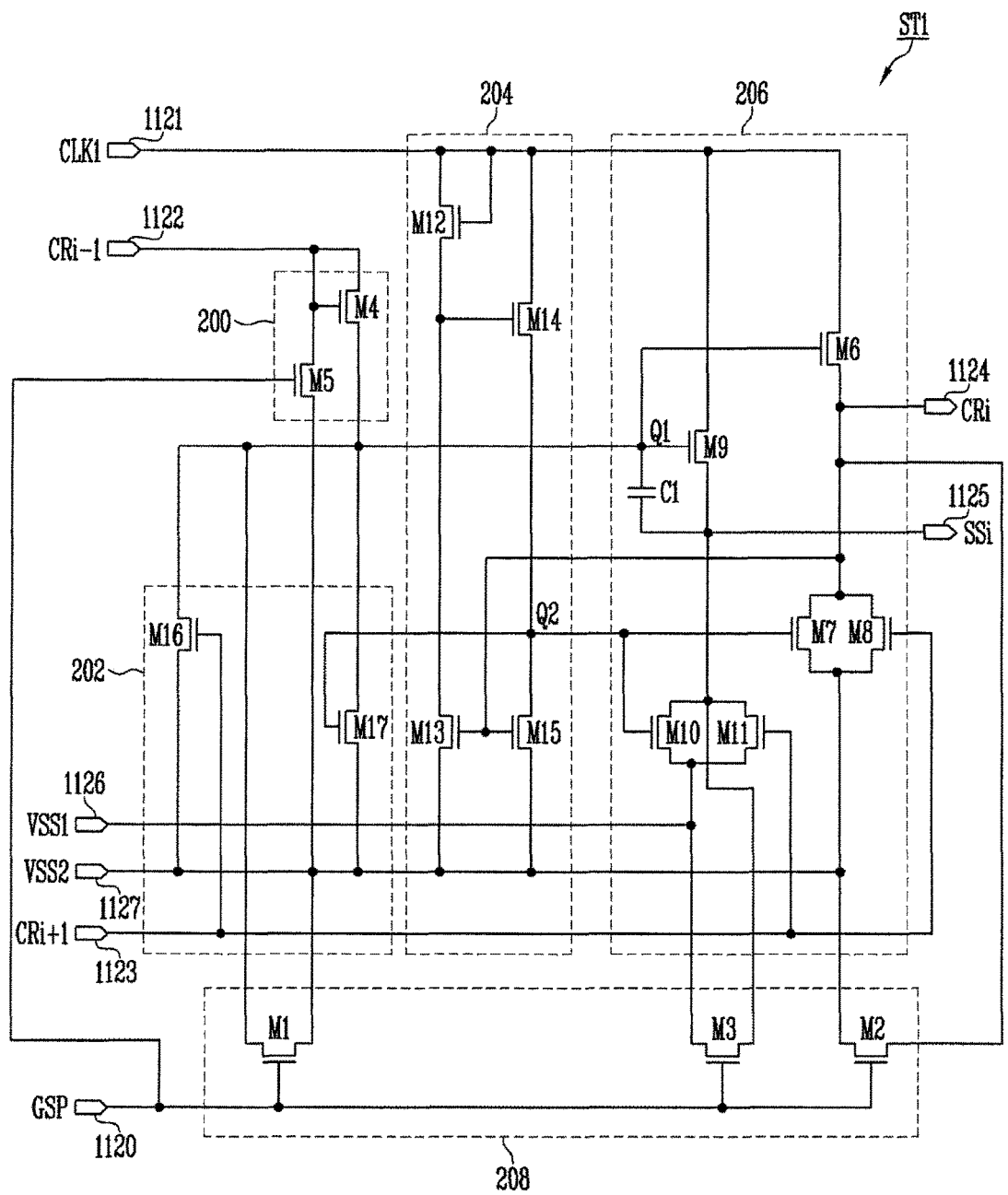
FIG. 13 is a circuit diagram illustrating a first stage according to an embodiment of the present disclosure.

FIG. 13 is a circuit diagram illustrating a first stage according to an example embodiment of the present disclosure. In FIG. 13, components that are the same or substantially the same as those of FIG. 5 are designated by like reference numerals, and their detailed descriptions will not be provided again.

Referring to FIG. 13, the pull-up unit 200 of the first stage ST1 includes a fourth transistor M4 and a fifth transistor M5.

A first electrode and a gate electrode of the fourth transistor M4 are coupled to the second input terminal 1122, and a second electrode of the fourth transistor M4 is coupled to the first node Q1. That is, the fourth transistor M4 is coupled in a diode form (e.g., diode coupled), and turned on when the (i−1)th carry signal CRi−1 is supplied to the second input terminal 1122.

The fifth transistor M5 is coupled between the second input terminal 1122 and the second power input terminal 1127. In addition, a gate electrode of the fifth transistor M5 is coupled to the reset input terminal 1120. The fifth transistor M5 is turned on when the gate start pulse GSP is supplied to the reset input terminal 1120, to supply the second off voltage VSS2 to the second input terminal 1122. That is, the fifth transistor M5 initializes the second input terminal 1122 when the gate start pulse GSP is supplied. Then, it is possible to prevent or substantially prevent the first stage ST1 from being driven due to noise of the second input terminal 1122.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Example embodiments have been disclosed herein, and although specific terms are employed, they are used and are to be interpreted in a generic and descriptive sense and not for purpose of limitation. In some cases, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A scan driver comprising:
a plurality of stages configured to receive one or more clock signals, each of the plurality of stages being configured to supply a carry signal to a corresponding first output terminal and to supply a scan signal to a corresponding second output terminal, corresponding to a voltage of a corresponding first node, each of the plurality of stages being configured to simultaneously receive a same gate start pulse; and
each of the plurality of stages comprises a reset unit, the reset unit being configured to initialize the first node, the first output terminal, and the second output terminal, corresponding to the gate start pulse supplied to a corresponding reset input terminal,
wherein an ith (i is a natural number greater than one) stage from among the stages comprises:
an output unit configured to supply an ith carry signal to the first output terminal, and to supply an ith scan signal to the second output terminal, corresponding to the voltage of the first node, a voltage of a second node, and a first clock signal supplied to a first input terminal;
a controller configured to control the voltage of the second node, corresponding to the first clock signal supplied to the first input terminal;
a pull-up unit configured to control the voltage of the first node, corresponding to an (i−1)th carry signal supplied to a second input terminal; and
a pull-down unit configured to control the voltage of the first node, corresponding to the voltage of the second node and an (i+1)th carry signal supplied to a third input terminal.

2. The scan driver of claim 1, wherein each of the plurality of stages comprises:
a first power input terminal configured to receive a first off voltage; and a second power input terminal configured to receive a second off voltage.

3. The scan driver of claim 2, wherein the second off voltage is a voltage level lower than that of the first off voltage.

4. The scan driver of claim 2, wherein the first off voltage and the second off voltage are a same voltage level.

5. The scan driver of claim 2, wherein the reset unit comprises:
a first transistor coupled between the first node and the second power input terminal, the first transistor comprising a gate electrode coupled to the reset input terminal;
a second transistor coupled between the first output terminal and the second power input terminal, the second transistor comprising a gate electrode coupled to the reset input terminal; and
a third transistor coupled between the second output terminal and the first power input terminal, the third transistor comprising a gate electrode coupled to the reset input terminal.

6. The scan driver of claim 5, wherein the first to third transistors are configured to be in a turn-on state when the gate start pulse is supplied.

7. The scan driver of claim 1, wherein a second clock signal having an inverted phase with respect to the first clock signal is to be supplied to a first input terminal of an (i−1)th stage from among the stages.

8. The scan driver of claim 2, wherein the pull-up unit comprises a fourth transistor comprising a first electrode and a gate electrode, the first electrode and the gate electrode being coupled to the second input terminal, and comprising a second electrode coupled to the first node.

9. The scan driver of claim 8, wherein the ith stage is a first stage, and the pull-up unit further comprises a fifth transistor coupled between the second input terminal and a second power input terminal, the fifth transistor comprising a gate electrode coupled to the reset input terminal.

10. The scan driver of claim 2, wherein the output unit comprises:
a sixth transistor coupled between the first input terminal and the first output terminal, the sixth transistor comprising a gate electrode coupled to the first node;
a seventh transistor coupled between the first output terminal and the second power input terminal, the seventh transistor comprising a gate electrode coupled to the second node;
an eighth transistor coupled between the first output terminal and the second power input terminal, the eighth transistor comprising a gate electrode coupled to the third input terminal;
a ninth transistor coupled between the first input terminal and the second output terminal, the ninth transistor comprising a gate electrode coupled to the first node;
a tenth transistor coupled between the second output terminal and the first power input terminal, the tenth transistor comprising a gate electrode coupled to the second node;
an eleventh transistor coupled between the second output terminal and the first power input terminal, the eleventh transistor comprising a gate electrode coupled to the third input terminal; and
a first capacitor coupled between the first node and the second output terminal.

11. The scan driver of claim 2, wherein the controller comprises:
a twelfth transistor comprising a first electrode and a gate electrode, the first electrode and the gate electrode being coupled to the first input terminal;
a thirteenth transistor coupled between a second electrode of the twelfth transistor and the second power input terminal, the thirteenth transistor comprising a gate electrode coupled to the first output terminal;
a fourteenth transistor coupled between the first input terminal and the second node, the fourteenth transistor comprising a gate electrode coupled to the second electrode of the twelfth transistor; and
a fifteenth transistor coupled between the second node and the second power input terminal, the fifteenth transistor comprising a gate electrode coupled to the first output terminal.

12. The scan driver of claim 2, wherein the pull-down unit comprises:
a sixteenth transistor coupled between the first node and the second power input terminal, the sixteenth transistor comprising a gate electrode coupled to the third input terminal; and
a seventeenth transistor coupled between the first node and the second power input terminal, the seventeenth transistor comprising a gate electrode coupled to the second node.

13. The scan driver of claim 12, wherein each of the sixteenth transistor and the seventeenth transistor comprises a plurality of transistors coupled in series.

14. The scan driver of claim 1, further comprising:
a first dummy stage located at a front end of a first stage from among the plurality of stages, the first dummy stage being configured to supply a first dummy carry signal to the first stage corresponding to the gate start pulse; and
a second dummy stage located at a rear end of a last stage from among the plurality of stages, the second dummy stage being configured to supply a second dummy carry signal to the last stage.

15. A scan driver comprising:
a plurality of stages configured to receive one or more clock signals, each of the plurality of stages being configured to supply a carry signal to a corresponding first output terminal and to supply a scan signal to a corresponding second output terminal, corresponding to a voltage of a corresponding first node, each of the plurality of stages being configured to simultaneously receive a same gate start pulse; and
each of the plurality of stages comprises a reset unit, the reset unit being configured to initialize the first node, the first output terminal, and the second output terminal, corresponding to the gate start pulse supplied to a corresponding reset input terminal,
wherein the gate start pulse has a width that is greater than or equal to that of a half period of a clock signal of the one or more clock signals.

16. A method of driving a scan driver including a plurality of stages supplied with one or more clock signals, the plurality of stages supplying carry signals to first output terminals, and supplying scan signals to second output terminals, corresponding to voltages of first nodes, each of the plurality of stages being configured to simultaneously receive a same gate start pulse, the method comprising:
initializing a first node, a first output terminal, and a second output terminal of each of the plurality of stages, when the gate start pulse is supplied, wherein the gate start pulse has a width that is greater than or equal to a half period of a clock signal of the one or more clock signals.

17. The method of claim 16, wherein, when a panel comprising the scan driver is driven at a low frequency, the stages maintain an initialization state, corresponding to the gate start pulse, and the clock signal maintains a low voltage during the low frequency driving.

18. The method of claim 16, wherein, when the gate start pulse is supplied, the second output terminal is supplied with a first off voltage, and the first node and the first output terminal are supplied with a second off voltage lower than the first off voltage.

* * * * *